US009460783B2

(12) United States Patent
Moschiano et al.

(10) Patent No.: US 9,460,783 B2
(45) Date of Patent: Oct. 4, 2016

(54) DETERMINING SOFT DATA

(71) Applicant: Micron Technology, Inc., Boise, ID (US)

(72) Inventors: Violante Moschiano, Avezzano (IT); Andrea D'Alessandro, L'Aquila (IT); Andrea Giovanni Xotta, Castelgomberto (IT)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 14/294,802

(22) Filed: Jun. 3, 2014

(65) Prior Publication Data
US 2015/0348619 A1 Dec. 3, 2015

(51) Int. Cl.
*G11C 29/00* (2006.01)
*G11C 11/56* (2006.01)
*G06F 11/10* (2006.01)
*G11C 29/04* (2006.01)

(52) U.S. Cl.
CPC ....... *G11C 11/5642* (2013.01); *G06F 11/1012* (2013.01); *G06F 11/1068* (2013.01); *G11C 2029/0411* (2013.01)

(58) Field of Classification Search
CPC .................. G11C 11/5642; G11C 2029/0411; G06F 11/1068; G06F 11/1012
See application file for complete search history.

(56) References Cited

U.S. PATENT DOCUMENTS

| | | | |
|---|---|---|---|
| 8,289,779 B2 | 10/2012 | Hoei | |
| 8,332,728 B2 | 12/2012 | Cheng et al. | |
| 8,446,786 B2 | 5/2013 | Pekny | |
| 2008/0092026 A1* | 4/2008 | Brandman | G06F 11/1072 714/793 |
| 2010/0020616 A1 | 1/2010 | Auclair et al. | |
| 2011/0167305 A1 | 7/2011 | Haratsch | |
| 2011/0305082 A1 | 12/2011 | Haratsch et al. | |
| 2012/0051144 A1 | 3/2012 | Weingarten et al. | |
| 2013/0104005 A1 | 4/2013 | Weingarten et al. | |
| 2013/0139036 A1 | 5/2013 | Lee | |
| 2013/0145235 A1 | 6/2013 | Alhussien et al. | |
| 2013/0185598 A1 | 7/2013 | Haratsch et al. | |
| 2013/0275829 A1* | 10/2013 | Sridhara | G06F 11/1048 714/755 |
| 2014/0104943 A1* | 4/2014 | Chen | G11C 11/5642 365/185.03 |

OTHER PUBLICATIONS

Peleato et al., "Towards Minimizing Read Time for NAND Flash", Global Communications Conference (GLOBECOM), 2012 IEEE, Dec. 3-7, 2012, 6 pp.
International Search Report and Written Opinion from related international application No. PCT/US2015/033475, dated Aug. 25, 2015, 16 pp.

* cited by examiner

*Primary Examiner* — Sam Rizk
(74) *Attorney, Agent, or Firm* — Brooks, Cameron & Huebsch, PLLC

(57) ABSTRACT

The present application includes apparatuses and methods for determining soft data. A number of embodiments include determining soft data associated with a data state of a memory cell. In a number of embodiments, the soft data may be determined by performing a single stepped sense operation on the memory cell.

28 Claims, 4 Drawing Sheets

US 9,460,783 B2

DETERMINING SOFT DATA

TECHNICAL FIELD

The present disclosure relates generally to semiconductor memory and methods, and more particularly, to determining soft data.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices may use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. However, a number of mechanisms, such as read disturb, program disturb, and/or charge loss (e.g., charge leakage), for example, can cause the Vt of the memory cell to change. As a result of the change in the Vt, an error may occur when the state of the cell is sensed. For example, the cell may be sensed to be in a state other than the target state (e.g., a state different than the state to which the cell was programmed). Such errors can be corrected by error correction code (ECC) schemes such as, for example, a low-density parity-check (LDPC) ECC scheme, which may utilize soft data associated with the data state of the cell to correct the error.

DETAILED DESCRIPTION

Figure 1:
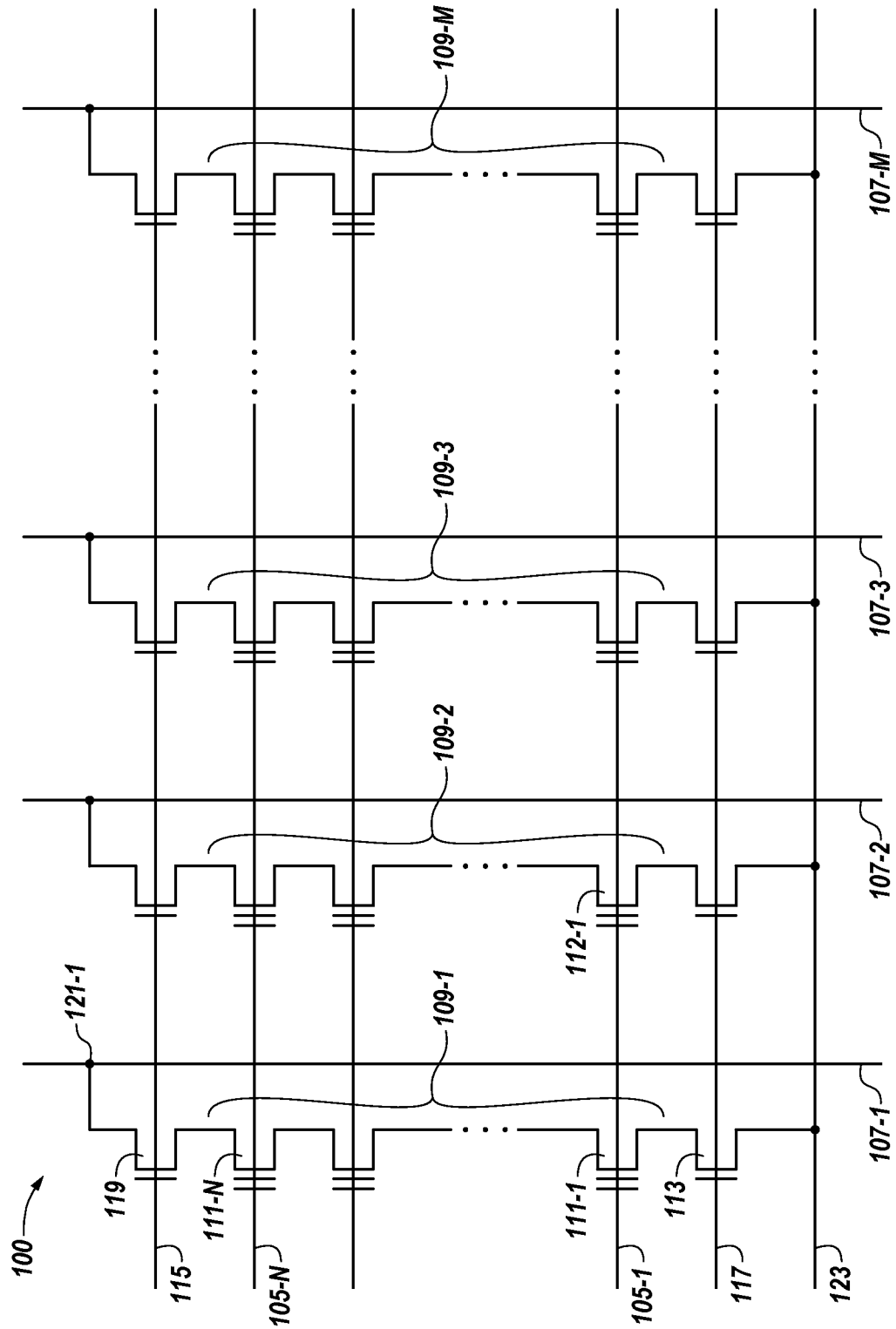
FIG. 1 illustrates a schematic diagram of a portion of a memory array in accordance with a number of embodiments of the present disclosure.

The present disclosure includes apparatuses and methods for determining soft data. A number of embodiments include determining soft data associated with a data state of a memory cell, wherein the soft data is determined by performing a single stepped sense operation on the memory cell.

Hard data can refer to a binary data value stored in one or more memory cells and provided to a host responsive to a sense (e.g., read) operation, for example. In various instances, soft data associated with the sensed data state (e.g., with the hard data) of the memory cell can also be determined. The soft data can, for example, indicate the quality and/or confidence of the hard data (e.g., information regarding the probability of the cell storing the read hard data or of the cell storing different data). Accordingly, soft data can provide benefits such as increased accuracy and/or reliability (e.g., decreased error rate), and/or increased memory life, among other benefits.

Embodiments of the present disclosure can determine soft data associated with the data state (e.g., with the hard data) of a memory cell by performing a single (e.g., only one) sense operation on the cell. For example, in embodiments of the present disclosure, the same sense operation can be used to determine both a hard data value and a number of soft data values. In contrast, in previous approaches, multiple (e.g., more than one) separate sense operations may need to be performed on the cell to determine the soft data. For example, in previous approaches, the soft data may be determined by performing one or more sense operations on the cell that are in addition to (e.g., separate from) the sense operation that determines the hard data. Because embodiments of the present disclosure can determine soft data by performing a single sense operation, embodiments of the present disclosure can determine the soft data faster than previous approaches that use multiple sense operations to determine the soft data, which can increase the efficiency and/or performance (e.g., speed) of the memory as compared with such previous approaches.

As used herein, "a number of" something can refer to one or more such things. For example, a number of memory cells can refer to one or more memory cells. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 500 in FIG. 5.

FIG. 1 illustrates a schematic diagram of a portion of a memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, . . . , 105-N) and data lines (e.g., bit lines) 107-1, 107-2, 107-3, . . . , 107-M. For ease of addressing in the digital environment, the number of word lines 105-1, . . . , 105-N and the number of bit lines 107-1, 107-2, 107-3, . . . , 107-M can be some power of two (e.g., 256 word lines by 4,096 bit lines).

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a bit line 107-1, 107-2, 107-3, . . . , 107-M. The non-volatile memory cells 111-1, . . . , 111-N of each NAND string 109-1, 109-2, 109-3, . . . , 109-M are connected in series between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source 123. The drain of source select gate 113 is connected to memory cell 111-1 of the corresponding NAND string 109-1. The drain of drain select gate 119 is connected to bit line 107-1 of the corresponding NAND string 109-1 at drain contact 121-1. The source of drain select gate 119 is connected to memory cell 111-N (e.g., a floating-gate transistor) of the corresponding NAND string 109-1.

In a number of embodiments, construction of non-volatile memory cells 111-1, . . . , 111-N includes a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

Subsets of cells coupled to a selected word line (e.g., 105-1, . . . , 105-N) can be programmed and/or sensed (e.g., read) together (e.g., at the same time). A program operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state (e.g., hard data value) of the selected cell. The sense operation (e.g., the same sense operation used to determine the hard data value of the selected cell) can also be used to determine soft data associated with the data state of the selected cell, as will be further described herein. The sense operation can include providing a voltage to (e.g., biasing) a bit line (e.g., bit line 107-1) associated with a selected memory cell above a voltage (e.g., bias voltage) provided to a source (e.g., source 123) associated with the selected memory cell. A sense operation could alternatively include precharging the bit line followed with discharge when a selected cell begins to conduct, and sensing the discharge. Examples of sense operations in accordance with embodiments of the present disclosure will be further described herein.

Sensing the state of a selected cell can include providing a number of stepped sensing signals (e.g., stepped sensing signals that include different read voltage levels) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of the selected cell, and the soft data associated with the data state, can be determined based on the current of the bit line corresponding to the selected cell, as will be further described herein.

When the selected cell is in a conductive state, current flows between the source contact at one end of the string and a bit line contact at the other end of the string. As such, the current associated with sensing the selected cell is carried through each of the other cells in the string and the select transistors.

Figure 2:
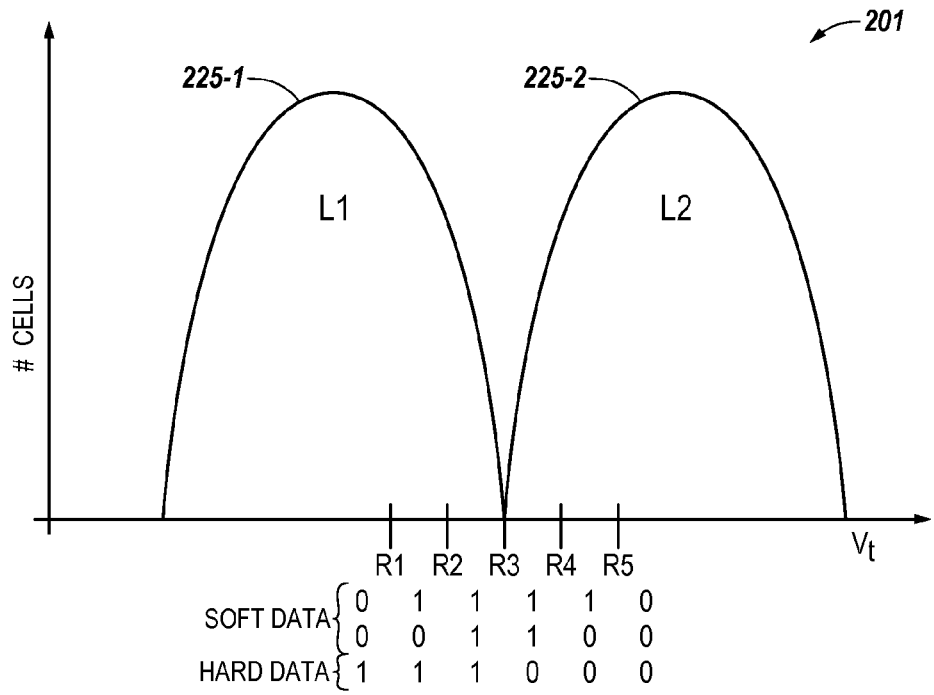
FIG. 2 illustrates a diagram of a number of threshold voltage distributions, sensing voltages, and data assignments associated with a sensing operation.

FIG. 2 illustrates a diagram 201 of a number of threshold voltage (Vt) distributions, sensing voltages, and data (e.g., hard and soft data) assignments associated with a sensing operation. The two Vt distributions 225-1 and 225-2 shown in FIG. 2 can correspond to two-bit (e.g., four-state) multi-level memory cells. As such, although not shown in FIG. 2, a two-bit memory cell would include two additional Vt distributions (e.g., one corresponding to each of the four data states). In this example, only the Vt distributions corresponding to data states L1 and L2 are shown. Embodiments of the present disclosure are not limited to two-bit memory cells.

As shown in FIG. 2, Vt distributions 225-1 and 225-2 represent two target data states (e.g., L1 and L2, respectively) to which the memory cells can be programmed. Each target data state has a lower page data value and an upper page data value corresponding thereto. In this example, data state L1 corresponds to data "11" (e.g., a lower page data value of 1 and an upper page data value of 1) and data state L2 corresponds to data "01" (e.g., a lower page data value of 1 and an upper page data value of 0). That is, the hard data values of the upper pages of target states L1 and L2 are 1 and 0, respectively. The hard data values of the lower pages of target states L1 and L2 are each 1. Embodiments of the present disclosure, however, are not limited to these particular data assignments.

Vt distributions 225-1 and 225-2 can represent a number of memory cells that are programmed to the corresponding target states (e.g., L1 and L2, respectively), with the height of a Vt distribution curve indicating a number of cells programmed to a particular voltage within the Vt distribution (e.g., on average). The width of the Vt distribution curve indicates the range of voltages that represent a particular target state (e.g., the width of the Vt distribution curve 225-2 for L2 represents the range of voltages that correspond to a hard data value of 01).

During a sense (e.g., read) operation, a sensing (e.g., read) voltage located between Vt distributions 225-1 and 225-2 can be used to distinguish between states L1 and L2. In a read operation performed on a selected memory cell in a NAND string, the unselected memory cells of the string can be biased with a pass voltage so as to be in a conducting state. When all cells in a string are in a conductive state, current can flow between the source contact at one end of the string and a drain line contact at the other end of the string. As such, the data state of the selected cell can be determined based on the current sensed on a bit line corresponding to a particular string when the selected cell begins to conduct (e.g., in response to the particular read voltage applied to the control gate of the cell (via a selected word line)), as will be further described herein.

Each data state (e.g., L1, and L2) of the memory cells can have soft data associated therewith. For instance, the Vt distribution (e.g., 225-1 or 225-2) associated with each data state can have soft data values (e.g., bits) assigned thereto. In the example illustrated in FIG. 2, two bits are used to provide soft data (e.g., quality and/or confidence information) associated with the data states.

Soft data (e.g., the soft data values) associated with a data state of a memory cell can indicate a location of the Vt associated with the memory cell within the Vt distribution associated with the data state of the memory cell. For example, in the embodiment illustrated in FIG. 2, soft data 00 associated with data state L2 indicates that the Vt of the memory cell is located at a voltage greater than reference voltage R5 within Vt distribution 225-2 (e.g., that the Vt of the memory cell is located toward the middle of Vt distribution 225-2), and soft data 00 associated with data state L1 indicates that the Vt of the memory cell is located at a voltage less than reference voltage R1 within Vt distribution 225-1 (e.g., that the Vt of the memory cell is located toward the middle of Vt distribution 225-1).

Additionally, soft data 10 associated with data state L2 indicates that the Vt of the memory cell is located at a voltage between reference voltages R4 and R5 within Vt distribution 225-2, and soft data 10 associated with data state L1 indicates that the Vt of the memory cell is located at a voltage between reference voltages R1 and R2 (e.g., soft data 10 indicates that the Vt of the memory cell is located closer toward the edge of the Vt distribution than soft data 00). Further, soft data 11 associated with data state L2 indicates that the Vt of the memory cell is located at a voltage between reference voltages R3 and R4, and soft data 11 associated with data state L1 indicates that the Vt of the memory cell is located at a voltage between reference voltages R2 and R3. As such, soft data 11 may indicate a lower confidence that the hard data matches the target state to which the cell was originally programmed.

Soft data (e.g., the soft data values) associated with a data state of a memory cell can also indicate a probability of whether the Vt associated with the memory cell corresponds to the data state of the memory cell. For example, in the embodiment illustrated in FIG. 2, soft data 00 associated with the data state L2 indicates a strong probability that the Vt of the memory cell corresponds to data state L2 (e.g., upper page hard data 0), soft data 10 associated with the data state L2 indicates a moderate probability (e.g., a probability that is less than the strong probability) that the Vt of the memory cell corresponds to data state L2, and soft data 11 associated with data state L2 indicates a weak probability (e.g., a probability that is less than the moderate probability) that the Vt of the memory cell corresponds to data state L2. Additionally, soft data 00 associated with the data state L1 indicates a strong probability that the Vt of the memory cell corresponds to data state L1 (e.g., upper page hard data 1), soft data 10 associated with data state L1 indicates a moderate probability that the Vt of the memory cell corresponds to data state L1, and soft data 11 associated with data state L1 indicates a weak probability that the Vt of the memory cell corresponds to data state L1.

Embodiments of the present disclosure are not limited to the reference voltages and/or soft data assignments shown in FIG. 2. For example, a greater number of soft data assignments can be used to indicate a more precise Vt location within a Vt distribution and/or a more precise probability of whether a Vt corresponds to a data state. However, for simplicity and so as not to obscure embodiments of the present disclosure, five reference voltages and six soft data values (e.g., six different soft data possibilities) representing six different hard data quality and/or confidence levels have been illustrated in FIG. 2.

The soft data values (e.g., at least two soft data values) associated with the data state of a memory cell can be determined by performing a single (e.g., only one) sense operation on the memory cell, as will be further described herein. For example, the soft data values associated with the data state of a memory cell can be determined using the same sense operation used to determine the data state of the cell, as will be further described herein. In contrast, in previous approaches, multiple (e.g., more than one) separate sense operations may need to be performed on a memory cell to determine the soft data associated with the data state of the cell. For example, in previous approaches, the soft data may be determined by performing one or more sense operations on the cell that are in addition to (e.g., separate from) the sense operation that determines the hard data. Because embodiments of the present disclosure can determine soft data by performing a single sense operation, embodiments of the present disclosure can determine the soft data faster than previous approaches that use multiple sense operations to determine the soft data, which can increase the efficiency and/or performance (e.g., speed) of the memory as compared with such previous approaches.

Figure 3:
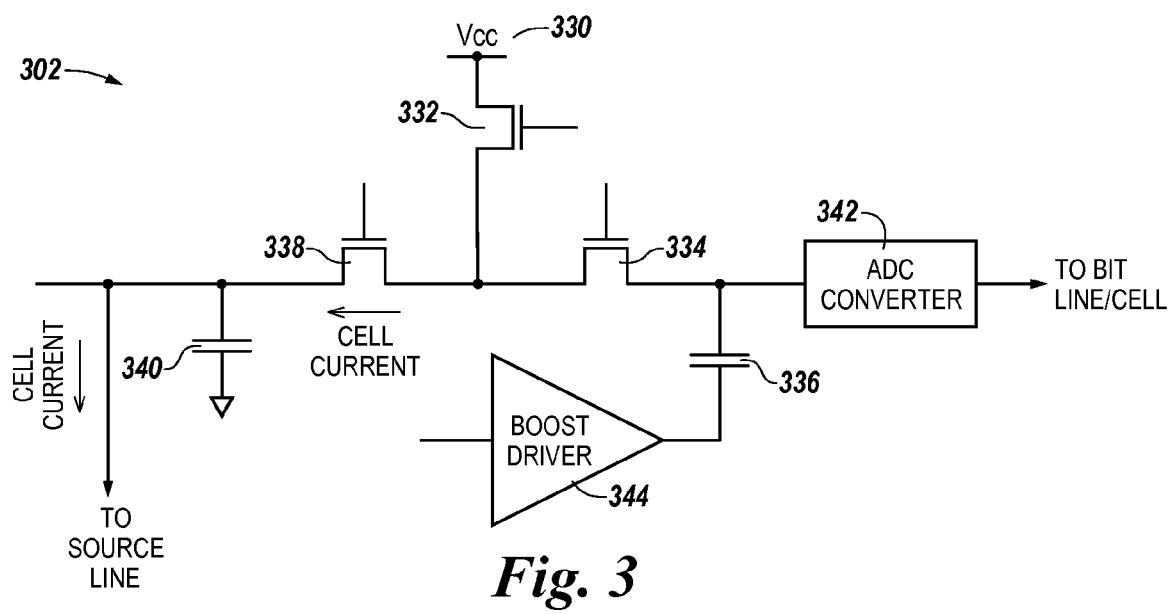
FIG. 3 illustrates a schematic diagram of sense circuitry in accordance with a number of embodiments of the present disclosure.

FIG. 3 illustrates a schematic diagram of sense circuitry 302 in accordance with a number of embodiments of the present disclosure. Sense circuitry 302 can perform a single (e.g., only one) sense operation on a memory cell (e.g., a memory cell 111-1, . . . , 111-N previously described in connection with FIG. 1) to determine the data state of the cell (e.g., a hard data value) and associated soft data (e.g., soft data values). The single sense operation can be, for example, an active sense operation, such as an active bit line sense operation (e.g., a sense operation in which a single bit line, which can be referred to as the active bit line, is selectively coupled to sense circuitry 302). That is, sense circuitry 302 can be active bit line sense circuitry (e.g., circuitry that can be selectively coupled to a single bit line). However, embodiments of the present disclosure are not limited to a particular type of sense circuitry or sense operation.

As shown in FIG. 3, sense circuitry 302 can be coupled (e.g., selectively coupled) to a bit line and a source of a memory array, such as bit lines 107-1, 107-2, 107-3, . . . , 107-M and source 123 of memory array 100 previously described in connection with FIG. 1. During the single sense operation, a single sensing signal (e.g., read voltage) can be applied to a selected memory cell (e.g., to the control gate of the cell) of the array by providing the single sensing signal to the word line (e.g., word line 105-1, . . . , 105-N previously described in connection with FIG. 1) to which the selected cell is coupled. That is, the single sense operation can be performed using only a single sensing signal. The single sensing signal can be, for example, a stepped sensing signal, as will be further described herein (e.g., in connection with FIGS. 4A and 4B).

In response to the single sensing signal being applied to the selected memory cell, sense circuitry 302 can sense the current on the bit line (e.g., the active bit line) to which the selected cell is coupled. That is, the single sense operation can sense only a single value associated with the selected memory cell (e.g., the current on the bit line to which the selected cell is coupled). This single value (e.g., the sensed bit line current) can be directly correlated to the threshold voltage of the selected cell. Accordingly, the data state of the selected cell, and the soft data associated therewith, can be determined based on the sensed single value (e.g., based on the sensed bit line current).

For example, as shown in FIG. 3, sense circuitry 302 can include transistor 334 and capacitance 336 (e.g., a discrete capacitor or parasitic capacitance) coupled to the bit line to which the selected cell is coupled, transistor 332 (e.g., bit line pre-charge transistor) coupled to a supply voltage node 330 (e.g., Vcc), and transistor 338 (e.g., bit line clamp transistor) coupled to transistors 332 and 334. During the sense operation, transistor 334 can be operated to float capacitance 336, and the current on the bit line to which the selected cell is coupled (e,g., the bit line current) can flow through, and be sensed via, transistors 338 and 332. Transistors 332 and 338 can be operated to sink the bit line current, which can sink the charge from capacitance 336. As such, the sensed bit line current (Isen) can be given by:

Isen=C336×((Vcc−V336)/tsen)

where C336 is the capacitance of capacitance 336, Vcc is supply voltage 330, V336 is the voltage across capacitance 336 during the sense operation, and tsen is the duration of the sense operation (e.g., the amount of time for which the sense operation lasts). Accordingly, the voltage across capacitance 336 (V336) during the sense operation can be given by:

V336=Vcc−((Isen×tsen)/C336)

That is, the voltage across capacitance 336 during the sense operation can be determined based on the sensed bit line current.

The data state of the selected cell, and the soft data associated therewith, can then be determined based on the voltage across capacitance 336 during the sense operation.

For example, as shown in FIG. 3, sense circuitry 302 can include an analog-to-digital (ADC) converter 342 coupled to capacitance 336 and the bit line to which the selected cell is coupled, and/or a boost driver 344 coupled to capacitance 336 (e.g., to the plate of capacitance 336 that is opposite from the plate coupled to ADC converter 342). ADC converter 342 and/or boost driver 344 can convert (e.g., perform an ADC conversion of) the voltage across capacitance 336 during the sense operation to a digital value that corresponds to the data state of the selected cell and the associated soft data (e.g., the digital values previously described in connection with FIG. 2). That is, ADC converter 342 and/or boost driver 344 can code the data state of the selected cell and the soft data associated therewith by performing an ADC conversion (e.g., translation) of the voltage across capacitance 336 during the sense operation. ADC converter 342 and/or boost driver 344 can be, for example, inverters, such as PMOS inverters. However, embodiments of the present disclosure are not limited to a particular type of ADC converter or boost driver.

Figure 4A:
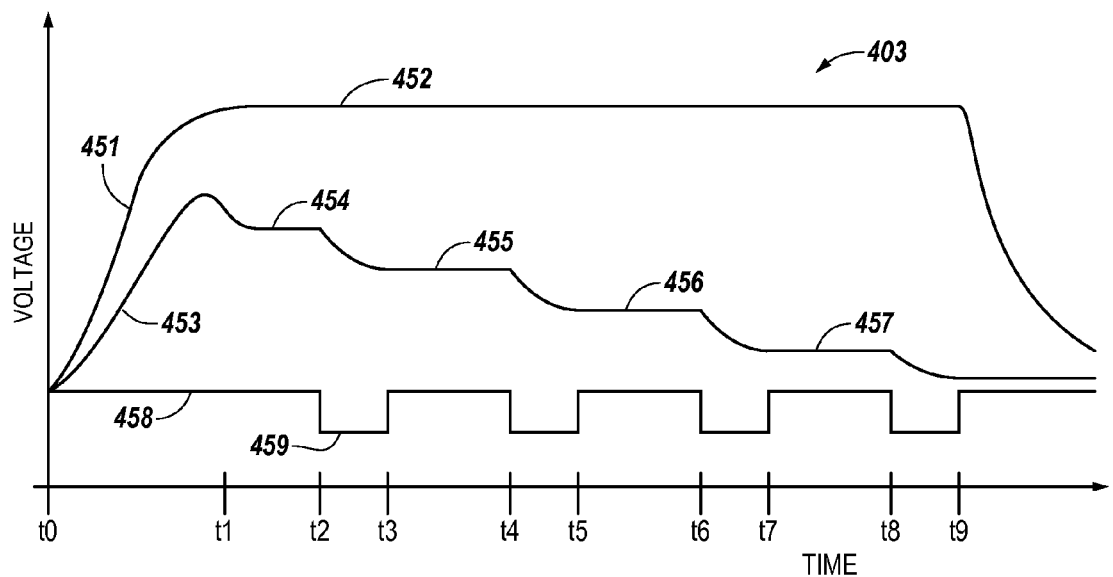
FIG. 4A illustrates an example of a timing diagram associated with a single sense operation in accordance with a number of embodiments of the present disclosure.
Figure 4B:
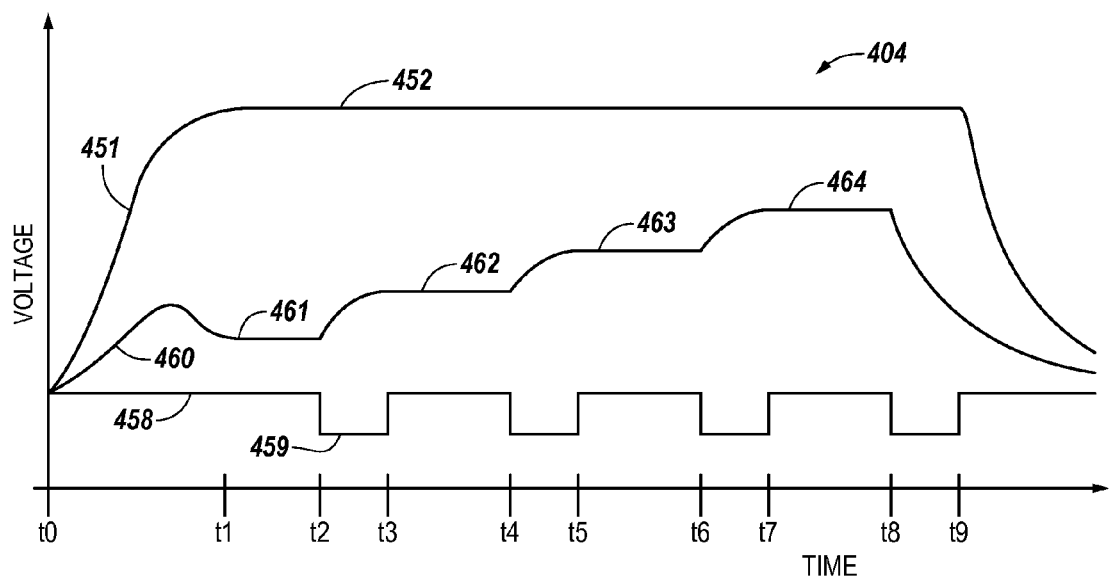
FIG. 4B illustrates an additional example of a timing diagram associated with a single sense operation in accordance with a number of embodiments of the present disclosure.

FIG. 4A illustrates an example of a timing diagram 403 associated with a single sense operation in accordance with one or more embodiments of the present disclosure. FIG. 4B illustrates an additional example of a timing diagram 404 associated with a single sense operation in accordance with one or more embodiments of the present disclosure. The single sense operation can be performed on an array of memory cells (e.g., array 100 previously described in connection with FIG. 1) to determine the data state of a selected cell and the associated soft data values, as previously described herein. In the examples illustrated in FIGS. 4A and 4B, the single sense operation can be a multilevel cell sense operation (e.g., a sense operation that determines the data state, and the soft data associated therewith, of a multilevel memory cell).

Timing diagrams 403 and 404 illustrate a number of waveforms (e.g., waveforms 451, 453, 458, and 460) associated with a single sense operation in accordance with the present disclosure. Waveform 451 represents a pass signal provided to the unselected word lines of the array (e.g., the word lines coupled to the unselected memory cells of the string that includes the selected cell). At an initial time (e.g., time t0), the unselected word lines are increased to pass voltage (e.g., read pass voltage) 452, as shown in FIGS. 4A and 4B. Providing the pass signal to the unselected word lines (e.g., increasing the unselected word lines to pass voltage 452) can place the unselected cells in a conducting state, as previously described herein.

Waveforms 453 and 460 each represent a single sensing signal provided to the selected word line of the array (e.g., the word line coupled to the selected cell). Providing the single sensing signal to the selected word line can apply the single sensing signal to the selected cell (e.g., to the control gate of the cell), as previously described herein.

In the examples illustrated in FIGS. 4A and 4B, the single sensing signal is a stepped sensing signal. In the example illustrated in FIG. 4A, the stepped sensing signal steps down. That is, at initial time t0, the selected word line is increased to voltage level 454. The selected word line is then stepped down (e.g., decreased) to voltage level 455 at time t2, further stepped down to voltage level 456 at time t4, and further stepped down to voltage level 457 at time t6, as shown in FIG. 4A. In the example illustrated in FIG. 4B, the stepped sensing signal steps up. That is, at initial time t0, the selected word line is increased to voltage level 461. The selected word line is then stepped up (e.g., increased) to voltage level 462 at time t2, further stepped up to voltage level 463 at time t4, and further stepped up to voltage level 464 at time t6. Embodiments of the present disclosure, however, are not limited to the stepped sensing signals illustrated in FIGS. 4A and 4B.

Waveform 458 represents a signal provided to transistor 334 previously described in connection with FIG. 3. As shown in FIGS. 4A and 4B, the signal can be provided to transistor 334 while the single sensing signal is being provided to the selected word line (e.g., after the sensing signal steps down or up through the respective different voltage levels), but may not be provided to transistor 334 (e.g., may be decreased to voltage level 459 or turned off) while the sensing signal steps up or down from the respective different voltage levels of the sensing signal. For instance, in the example illustrated in FIG. 4A, the signal can be provided to transistor 334 while voltages 454, 455, 456, and 457 are being provided to the selected word line (e.g., from time t1 to time t2, from time t3 to time t4, from time t5 to time t6, and from time t7 to time t8), but not while the sensing signal steps down from voltage level 454 to voltage level 455 (e.g., from time t2 to time t3), while the sensing signal steps down from voltage level 455 to 456 (e.g., from time t4 to time t5), while the sensing signal steps down from voltage level 456 to 457 (e.g., from time t6 to time t7), or while the sensing signal steps down from voltage level 457 (e.g., from time t8 to time t9). In the example illustrated in FIG. 4B, the signal can be provided to transistor 334 while voltages 461, 462, 463, and 464 are being provided to the selected word line (e.g., from time t1 to time t2, from time t3 to time t4, from time t5 to time t6, and from time t7 to time t8), but not while the sensing signal steps up from voltage level 461 to voltage level 462 (e.g., from time t2 to time t3), while the sensing signal steps up from voltage level 462 to 463 (e.g., from time t4 to time t5), while the sensing signal steps up from voltage level 463 to 464 (e.g., from time t6 to time t7), or while the sensing signal steps down from voltage level 464 (e.g., from time t8 to time t9). Providing the signal to transistor 334 can float capacitance 336, as previously described in connection with FIG. 3.

The current on the bit line to which the selected cell is coupled (e.g., the bit line current) can be sensed while the signal represented by waveform 458 is provided to transistor 334 (e.g., while the respective different voltage levels of the single sensing signal represented by waveforms 453 and 460 is being provided to the selected word line). For instance, in the examples illustrated in FIGS. 4A and 4B, the bit line current can be sensed from time t1 to time t2, from time t3 to time t4, from time t5 to time t6, and from time t7 to time t8. The bit line current can sensed by, for example, sense circuitry 302 previously described in connection with FIG. 3.

The data state of the selected cell, and the soft data associated therewith, can be determined based on the sensed bit line current, as previously described herein (e.g., in connection with FIG. 3). The data state and the associated soft data can be determined while the signal represented by waveform 458 is not being provided to transistor 334 (e.g., while the single sensing signal represented by waveforms 453 and 460 steps up or down through the respective voltage levels). For instance, in the examples illustrated in FIGS. 4A and 4B, the data state and the soft data can be determined from time t2 to time t3, from time t4 to time t5, from time t6 to time t7, and from time t8 to time t9.

By determining the soft data while the single sensing signal steps up or down through the respective voltage levels, embodiments of the present disclosure can determine the soft data faster than previous approaches (e.g., approaches that use multiple distinct sense operations using different discrete read voltages to determine the soft data). Accordingly, determining the soft data while the single sensing signal steps up or down through different respective voltage levels in accordance with embodiments of the present disclosure can increase the efficiency and/or performance (e.g., speed) of memory as compared with such previous approaches. Soft data obtained in accordance with embodiments described herein can be used by error detection/correction components (e.g., LDPC) to detect and/or correct errors in a more efficient manner as compared to previous approaches.

Figure 5:
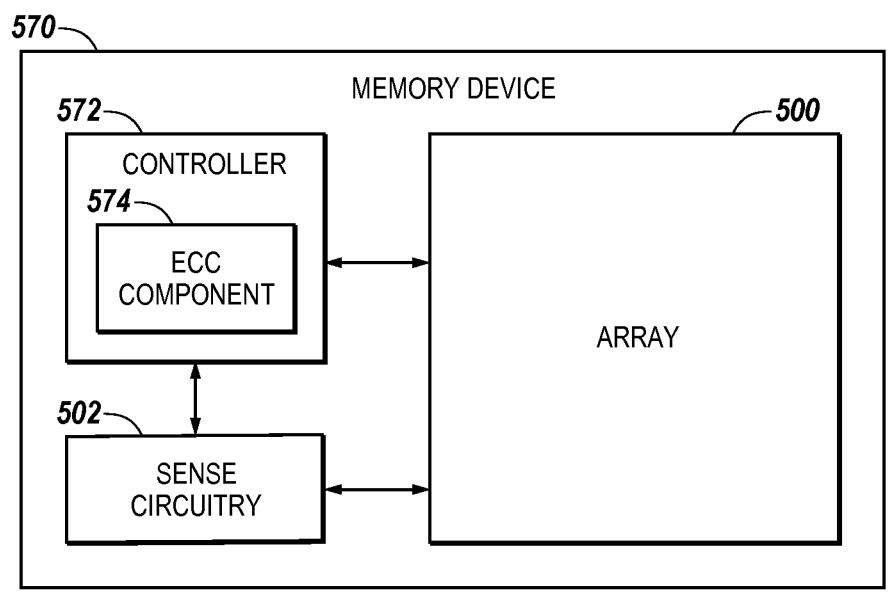
FIG. 5 illustrates a block diagram of an apparatus in the form of a memory device in accordance with a number of embodiments of the present disclosure.

FIG. 5 illustrates a block diagram of an apparatus in the form of a memory device 570 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 5, memory device 570 includes a controller 572 and sense circuitry 502 coupled to a memory array 500. Sense circuitry 502 can be, for example, sense circuitry 302 previously described in connection with FIG. 3. For example, sense circuitry 302 can determine the data state of a memory cell of memory array 500, and the soft data (e.g., soft data values) associated therewith, by performing a single sense operation, as previously described herein. Memory array 500 can be, for example, memory array 100 previously described in connection with FIG. 1. Although one memory array is shown in FIG. 5, embodiments of the present disclosure are not so limited (e.g., memory device 570 can include more than one memory array coupled to controller 572).

Controller 572 can include, for example, control circuitry and/or logic (e.g., hardware and/or firmware). For instance, controller 572 can include error correction code (ECC) component 574, as illustrated in FIG. 5. ECC component 574 can utilize the soft data determined by sense circuitry 302 to correct errors that occur when the data state of the memory cells of memory array 500 are sensed. For example, ECC component 574 can utilize the soft data in a low-density parity-check (LDPC) ECC scheme to correct the errors. That is, ECC component 574 can be an LDPC ECC component.

Controller 572 can be included on the same physical device (e.g., the same die) as memory array 500, or can be included on a separate physical device that is communicatively coupled to the physical device that includes memory array 500. In a number of embodiments, components of controller 572 can be spread across multiple physical devices (e.g., some components on the same die as the array, and some components on a different die, module, or board).

Controller 572 can operate sense circuitry 502 to perform sense operations in accordance with a number of embodiments of the present disclosure to determine the data state, and soft data associated therewith, of the memory cells in memory array 500. For example, controller 572 can operate sense circuitry 502 to determine the soft data values associated with the data state of the cells by performing a single sense operation on the cells in accordance with a number of embodiments of the present disclosure.

The embodiment illustrated in FIG. 5 can include additional circuitry that is not illustrated so as not to obscure embodiments of the present disclosure. For example, memory device 570 can include address circuitry to latch address signals provided over I/O connectors through I/O circuitry. Address signals can be received and decoded by a row decoder and a column decoder, to access memory array 500.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory, comprising:
   determining soft data associated with a data state of a memory cell;
   wherein the soft data is determined by performing a single stepped sense operation on the memory cell, wherein performing the single stepped sense operation on the memory cell includes applying a single stepped sensing signal to the memory cell.

2. The method of claim 1, wherein the method includes determining the data state of the memory cell by performing the single stepped sense operation on the memory cell.

3. The method of claim 1, wherein:
   performing the single stepped sense operation on the memory cell includes sensing a single value associated with the memory cell; and
   the soft data is determined based on the single value.

4. The method of claim 1, wherein performing the single stepped sense operation comprises performing an active sense operation.

5. An apparatus, comprising:
   an array of memory cells; and
   a controller configured to operate sense circuitry to:
   perform a single stepped sense operation on a memory cell of the array by applying a single stepped sensing signal to the memory cell; and
   determine soft data associated with a data state of the memory cell based on the single stepped sense operation.

6. The apparatus of claim 5, wherein the controller is configured operate the sense circuitry to:
   perform the single stepped sense operation to sense a current associated with the memory cell; and
   determine the soft data based on the sensed current.

7. The apparatus of claim 6, wherein the current associated with the memory cell is a current on a data line to which the memory cell is coupled.

8. The apparatus of claim 6, wherein the controller is configured to operate the sense circuitry to determine the soft data based on the sensed current by:
   determining, based on the sensed current, a voltage associated with a capacitance coupled to the memory cell during the single stepped sense operation; and
   determining the soft data based on the determined voltage.

9. The apparatus of claim 8, wherein the sense circuitry includes an analog-to-digital converter configured to convert the determined voltage to a digital value, wherein the digital value corresponds to the soft data.

10. The apparatus of claim 9, wherein the analog-to-digital converter comprises an inverter.

11. A method for operating memory, comprising:
    performing a single stepped sense operation on a memory cell to determine:
    a data state of the memory cell; and
    at least two soft data values associated with the data state of the memory cell;
    wherein performing the single stepped sense operation on the memory cell includes applying a single stepped sensing signal to the memory cell.

12. The method of claim 11, wherein performing the single stepped sense operation includes sensing a current associated with the memory cell, and wherein determining the data state of the memory cell and the at least two soft data values comprises:
    determining, based on the sensed current, a voltage associated with a capacitance coupled to the memory cell during the single stepped sense operation; and
    converting the determined voltage to a digital value, wherein the digital value corresponds to the data state and the at least two soft data values.

13. The method of claim 12, wherein the voltage (V) associated with the capacitance coupled to the memory cell during the single stepped sense operation is given by:

$$V = Vcc - ((Isen \times tsen)/C)$$

wherein Vcc is a supply voltage associated with the single stepped sense operation, Isen is the sensed current, tsen is a duration of the single stepped sense operation, and C is the capacitance.

14. The method of claim 11, wherein the method includes correcting an error associated with the determined data state of the memory cell using the at least two soft data values.

15. The method of claim 11, wherein the at least two soft data values indicate a location of a threshold voltage associated with the memory cell within a threshold voltage distribution associated with the data state of the memory cell.

16. The method of claim 11, wherein the single stepped sense operation is a multilevel cell sense operation.

17. An apparatus, comprising:
    an array of memory cells; and
    a controller, wherein:
    the controller is configured to operate sense circuitry to:
    perform a single stepped sense operation on a memory cell of the array to sense a single value associated with the memory cell, wherein performing the single stepped sense operation on the memory cell includes applying a single stepped sensing signal to the memory cell; and determine soft data values associated with a data state of the memory cell based on the single value; and the controller includes an error correction component configured to correct an error associated with the data state of the memory cell using the determined soft data values.

18. The apparatus of claim 17, wherein the error correction component is a low-density parity-check error correction component.

19. The apparatus of claim 17, wherein the single value is a current associated with the memory cell.

20. The apparatus of claim 17, wherein the controller is configured to operate the sense circuitry to determine the soft data values by:
  determining, based on the single value, a voltage associated with a capacitance coupled to the memory cell during the single stepped sense operation; and
  determining the soft data values based on the determined voltage.

21. An apparatus, comprising:
an array of memory cells; and
a controller configured to operate sense circuitry to:
  perform a single stepped sense operation on a memory cell of the array to sense a single value associated with the memory cell, wherein performing the single stepped sense operation on the memory cell includes applying a single stepped sensing signal to the memory cell;
  determine a data state of the memory cell based on the single value; and
  determine at least two soft data values associated with the data state of the memory cell based on the single value.

22. The apparatus of claim 21, wherein the controller is configured to operate the sense circuitry to determine the data state and the at least two soft data values based on a supply voltage associated with the single stepped sense operation, a duration of the single stepped sense operation, and a capacitance of a capacitance coupled to the memory cell.

23. The apparatus of claim 21, wherein the at least two soft data values indicate a probability of whether a threshold voltage associated with the memory cell corresponds to the data state of the memory cell.

24. An apparatus, comprising:
an array of memory cells; and
a controller configured operate sense circuitry to:
  perform a single stepped sense operation on a memory cell of the array by applying a single stepped sensing signal to the memory cell; and
  determine at least two soft data values associated with a data state of the memory cell based on the single stepped sense operation.

25. The apparatus of claim 24, wherein the stepped sensing signal steps down.

26. The apparatus of claim 25, wherein the controller is configured to operate the sense circuitry to determine the at least two soft data values while the stepped sensing signal steps down.

27. The apparatus of claim 24, wherein the stepped sensing signal steps up.

28. The apparatus of claim 27, wherein the controller is configured to operate the sense circuitry to determine the at least two soft data values while the stepped sensing signal steps up.

* * * * *